United States Patent [19]

Eltoukhy et al.

[11] Patent Number: 4,604,179
[45] Date of Patent: Aug. 5, 1986

[54] SPUTTERING-SYSTEM BAFFLE

[75] Inventors: Atef Eltoukhy, San Jose; Rick C. Price, Fremont, both of Calif.

[73] Assignee: Trimedia Corporation, Fremont, Calif.

[21] Appl. No.: 706,737

[22] Filed: Feb. 28, 1985

[51] Int. Cl.$^4$ .................. C23C 15/00; H01J 37/08
[52] U.S. Cl. .................. 204/298; 204/192 C; 428/621; 428/667
[58] Field of Search .................. 204/298, 192

[56] References Cited

U.S. PATENT DOCUMENTS 4,381,453  4/1983  Cuomo et al. .................. 204/298
4,392,931  7/1983  Maniv et al. .................. 204/298

Primary Examiner—Veronica O'Keefe
Attorney, Agent, or Firm—Ciotti & Murashige

[57] ABSTRACT

A baffle for use in achieving a substantially isotropic grain structure in a crystalline layer which is sputtered onto a substrate by moving the substrate linearly, and without rotation, in a front-to-back direction below a sputtering target. The baffle has front and back shields which are adapted to limit deposition of sputtered material onto the moving substrate substantially to substrate regions which directly underlie the target. A pair of strips in the baffle are constructed to effect substantially symmetrical sputtering of material onto the substrate surface from opposite target side directions, to produce an isotropic crystal structure during early phases of film deposition.

7 Claims, 9 Drawing Figures

४,६०४,१७९

SPUTTERING-SYSTEM BAFFLE

FIELD OF THE INVENTION

The present invention relates to a sputtering system for use in forming a crystalline thin-film layer on a substrate, and more particularly, to a baffle for use in achieving a substantially isotropic grain structure in the sputtered layer.

BACKGROUND OF THE INVENTION

Sputtering, referring to vapor deposition of an ion-bombarded target metal to form a thin metal film on a substrate, is widely used in the electronics industry. Thin-film magnetic recording disks, for example, are advantageously formed by sputtering successive thin-film layers, including an outer magnetic thin film, on a suitable disk-like substrate. Thin-film sputtering may be used in preparing optical recording medium and in semiconductor fabrication, for producing metal conductive layers on a silicon substrate.

The usual sputtering system consists of a series of sputtering stations at which successive thin-film layers are deposited on a substrate, as the substrate passes through the stations in a continuous through-put operation. Each station typically includes a target which is dimensioned to "cover" one or more substrates, as these are moved on a pallet below the target device. For example, in the usual commercial sputtering system used in forming thin-film magnetic recording media, a pair of disk-like substrates, carried in a side-by-side arrangement on a pallet, is moved through a succession of sputtering stations, in a front-to-back direction, to produce one or more underlayers, an outer magnetic thin film, and a protective coating. The overall method provides efficient, high through-put production of multi-layered thin-film media.

Despite these advantages, sputtering systems of the type mentioned above have not been entirely satisfactory, in that the sputtered layer may show significant crystal anisotropy and/or variations in layer thickness. Both types of surface nonuniformities lead to angular variations in magnetic signal properties, particularly at outer-track regions of a magnetic disk. As will be seen below, signal-amplitude variations of up to about 25%, as measured at an inner-diameter recording track, and up to about 40% as measured at an outer-diameter recording track, are typical in magnetic recording disks formed in sputtering systems of the type described above.

In theory, it should be possible to eliminate crystal anisotropy and variations in film thickness in a sputtering operation by rotating the substrates as they pass through each of the sputtering stations. However, it would be relatively difficult and expensive to adapt existing types of sputtering systems to provide simultaneous linear and rotational substrate movement through the various sputtering stations. An alternative approach which is compatible with the design of existing commercial sputtering machines would be to partition each sputtering target into a number of smaller target regions by placing multiple shields or baffles between the target and the region where deposition occurs. These baffles would act to prevent all but direct, high-angle deposition from the target onto the substrate. A number of baffle configurations, including a multi-web lattice or a plurality of relatively close-packed cylinders, would be suitable. Although this approach would result in a sputtered layer having an isotropic crystal structure and relatively uniform thickness, the time and amount of target material needed to form the layer would be relatively great, since a major portion of the sputtered material would be deposited on the walls of the baffles. Maintenance problems related to removing deposited material from the baffles regularly would be considerable, as well.

BACKGROUND OF THE INVENTION

It is therefore an object of the present invention to provide, in combination with a sputtering system of the type described, a baffle which allows both substantially isotropic grain structure and uniform film thickness to be achieved in an efficient sputtering operation.

Providing a method for producing, in an efficient, high through-put processing system, a magnetic recording medium having substantially uniform recording signal amplitude characteristics is another object of the invention.

Still another object of the invention is to provide a magnetic recording medium which shows angular variations in peak-to-peak recording signal amplitudes of no greater than about 10%.

The baffle of the invention is designed for use in a sputtering system having a target for sputtering a thin-film crystalline layer on a substrate, as the substrate is moved linearly, and without rotation, successively through front and back deposition regions below the target in a sputtering station. The baffle, when positioned operationally between the target and such deposition regions, includes a front shield adapted to limit deposition of sputtered material onto the substrate moving through the front deposition region substantially to substrate areas which directly underline the target. A pair of baffle strips extending in a generally front-to-back direction above opposite sides of the substrate, with such in the front deposition region, effect substantially symmetrical sputtering of material onto the substrate surface from opposite target side directions. The strips cooperate with baffle structure in the baffle to limit deposition onto the substrate, with such in the back deposition region, to sputtering angles which are substantially the same in magnitude as those seen by the substrate in the front deposition region.

In one embodiment of the invention, the baffle structure includes a back shield, and the baffle strips extend between the front and back shields and define therewith a substantially square window through which the entire substrate can be viewed, when the substrate is moved to a position directly below the target.

In another embodiment, the baffle strips form a curved member which defines, with the front shield, a semi-circular window through which the front half of a substrate can be viewed, with the substrate moved about halfway into the region directly below the target.

The baffle may include one or more deflectors constructed to provide progressively less shielding of outer side regions of a circular substrate moving in a front-to-back direction under the target.

Also forming part of the invention is a method for sputtering onto a substrate, a crystalline thin-film layer having a substantially isotropic grain structure. The method is applicable particularly to producing a thin-film magnetic recording medium which gives fluctuations in peak-to-peak recording signal amplitude, over an entire circular recording path, of no more than about 10%.

These and other objects and features of the present invention will become more fully apparent when the following detailed description of the invention is read in conjunction with the accompanying drawings.

DETAILED DESCRIPTION OF THE INVENTION

Figure 1:
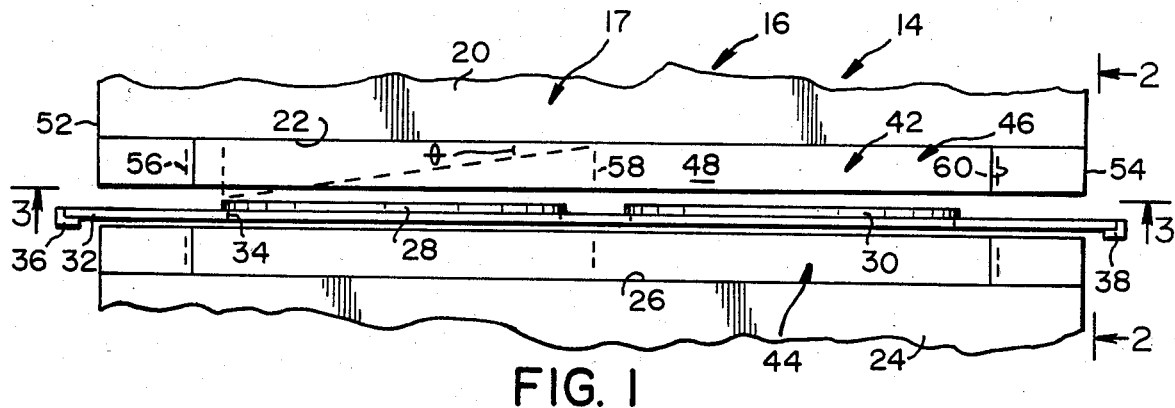
FIG. 1 in a front-on view of a sputtering station in a system employing baffles constructed according to the invention.
Figure 2:
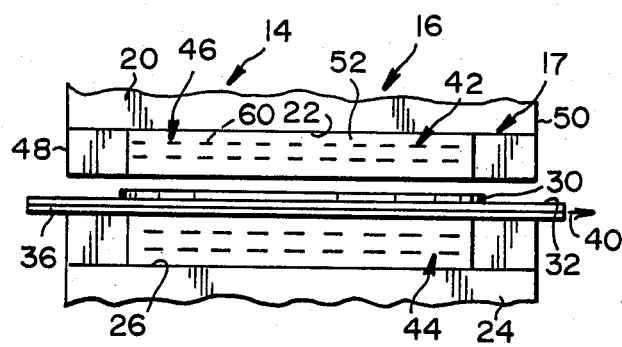
FIG. 2 shows the sputtering station of FIG. 1, as viewed from the side, along line 2—2 in FIG. 1.

FIGS. 1 and 2 show, respectively, simplified front-on and side views of the sputtering station 14, in a multistation sputtering apparatus 16. The apparatus generally includes a sputtering system 17 having at one or more of its sputtering stations baffles constructed according to the present invention. The sputtering system is preferably a commercially available system, such as is manufactured by Circuits Processing Apparatus (Fremont, CA), ULVAK (Japan), Leybald Heraeus (Germany), VACTEK (Boulder, CO), or Materials Research Corporation (Albany, NY). These systems are double-sided, in-line, high-throughput machines having two interlocking chambers, for loading and unloading.

The sputtering station generally includes an upper target 20 having a target surface 22, and a lower target 24, whose target surface 26, confronts surface 22, as shown. Each target has a rectangular shape which is dimensioned to "cover" a pair of substrates such as substrates 28, 30, moving through the sputtering station. That is, with the two substrates in the center of the sputtering station, as shown, the two substrates lie entirely above or below the two targets. In one sputtering system which will be illustrated herein, designed for use in producing one or more thin layers on a 5¼ in. diameter substrate, the target has rectangular dimensions of about 16.5 in. by 7 in. The target is adapted for sputtering a pure metal or metal alloy material onto a substrate, by bonding a film of the metal material on the target backing. The rate of deposition is controlled conventionally, and is adjustable to vary the thickness of a layer being formed on the substrate, with such moving through the station at a given speed.

Substrates, such as substrates 28, 30, are supported in a side-by-side fashion seen in FIG. 1 on a pallet 32. Each substrate, such as substrate 28, is carried on the pallet in a recessed rim of an opening, such as the one shown at 34 in FIG. 1. The openings permit deposition of sputtered material from target 24 onto the lower faces of the two substrates.

Pallet 32 is mounted in the sputtering system for movement through the sputtering station, in a front-to-back direction, on a pair of tacks 36, 38, which extend through the one or more stations in the system. The two tracks may be electrically isolated to allow a desired voltage potential to be placed on the substrates through the pallets, which are preferably formed of conductive material. The pallet is positioned within the sputtering station on tracks 36, 38, to place the upper and lower surfaces approximately equal distances from the sputtering surfaces of the upper and lower targets, respectively, so that thin-film deposition is symmetrical with respect to the two surface planes of each substrate.

A conventional chain drive is operable to move pallet 32 (and a succession of substrate-carrying pallets) through the one or more sputtering stations in the system, in a front-to-back direction (left-to-right in FIG. 2. The chain drive, which is also referred to herein as moving means, is indicated by arrow 40 in FIG. 2, which indicates the direction of pallet movement. The pallets are moved typically at a rate of between about 5–100 cm/min.

Also shown in the FIGS. 1 and 2 are identical baffles 42, 44 which are constructed according to novel features of the present invention. The two baffles replace the usual rectangular metal frames which are used conventionally in sputtering systems of the type under discussion, and are bolted on the targets in the same manner that conventional frames are.

Figure 4:
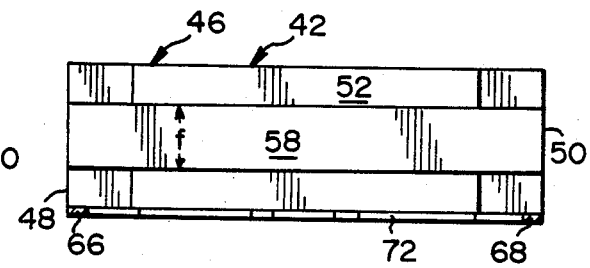
FIG. 4 is a sectional view of the baffle, taken generally along the line 4—4 in FIG. 3.

Baffle 42, which is representative, will be described with particular reference to FIGS. 3 and 4. The baffle includes a generally rectangular frame 46, having notched corners, such as corner 47, seen in FIG. 3. The frame has substantially the same rectangular dimensions as the target, whose square corners are seen in dashed lines at 20 in FIG. 3. In the system where the target has the above-mentioned planar dimensions of about 16.5 times 7 in., the baffle has the approximate dimensions, identified by the designated arrows, as follows: a=2.1 in., b=12.5 in., c=0.9 in., and d=5.25 in. The target and baffle having the dimensions noted are designed for use in sputtering on a 5¼ in. or smaller-diameter substrates. The target and baffle dimensions can be increased, in a roughly proportional manner, to accommodate sputtering onto larger substrates.

Figure 3:
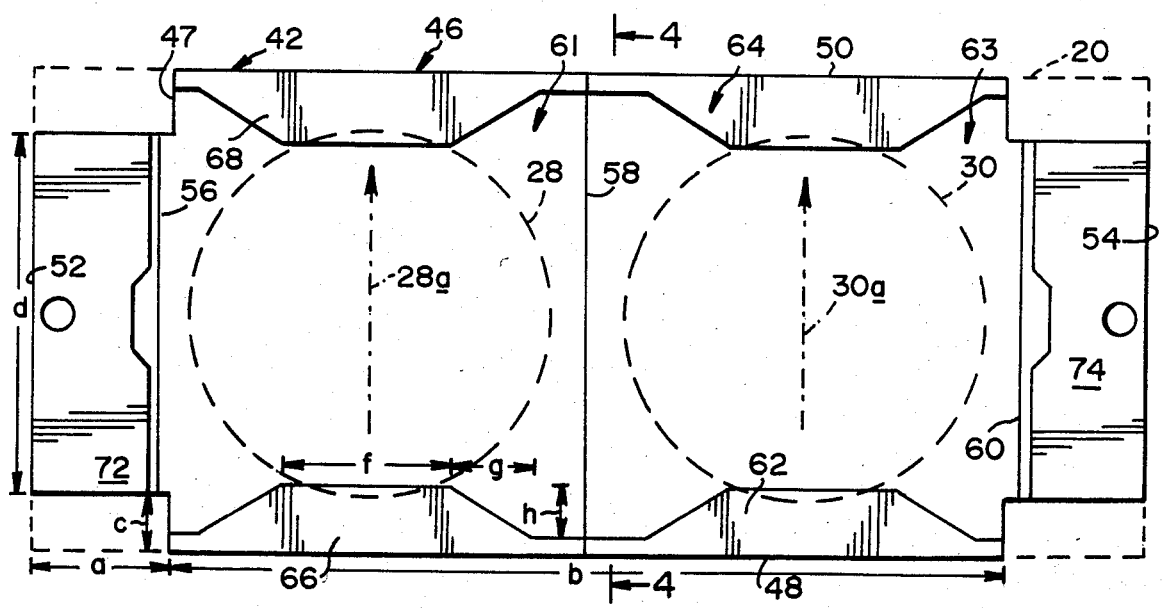
FIG. 3 is a plan view of a baffle constructed according to one embodiment of the invention.

The baffle frame is composed of front and back shields, or frame members 48, 50, respectively, each having the outer notched or stepped regions forming the frame notches, such as notch 47 seen in FIG. 3. The front and back frame members are joined, as by welding, at their side edges by a pair of side frame members, 52, 54, to form the rigid frame structure. The width of the frame in the embodiment under consideration is about 2.2 in. With the baffles placed operationally on the respective targets, the distance between the substrate and the lower edge of the baffle is about 0.5 in.

The baffle includes three strips, 56, 58, 60, extending between the front and back frame members (FIG. 3), and attached thereto as by welding. The central strip is disposed midway between the sides of the baffle and therefore extends along the front-to-back center line of the associated target, with the baffle placed operationally on the target. Each of the other two strips is positioned, with respect to the center strip, an equal distance from the center-line path of travel of the associated substrate; that is, strips 56 and 58 are equidistant from the center-line path of travel of substrate 28, indicated by dash-dot line 28a in FIG. 3, and strips 58, 60 are equidistant from the center-line path of travel of substrate 30, indicated by dash-dot line 30a. Strips 56, 58, in conjunction with adjoining portions of frame members 48, 50, define a substantially square window 61 in which the entire substrate (shown in dashed lines in 28) can be viewed, when the substrate is positioned centrally with respect to the baffle as indicated. Similarly, strips 58, 60 form with adjoining portions of frame members 48 and 50, a second substantially square window 63 through which the entire region of the side-adjacent substrate, shown by dashed line 30, can be viewed.

The width of the strips is selected to produce a desired amount of shielding of target material being sputtered in side-to-side directions (right/left directions in FIGS. 1 and 3) as will be detailed below. Generally, where greater crystal isotropy is desired in the sputtered layer, the selected strip width will be greater, to insure more symmetrical deposition of sputtered material onto the substrate and to effect greater shielding of low-angle material. In the particular baffle under discussion, having a frame width of about 2.2 in., the strip thickness indicated, by arrow f in FIG. 4, is between about 0.5–1.5 in. The strips are positioned about midway between the top and bottom edges of the frame as shown.

Looking at FIG. 3, the baffle further includes front and back shield plates 62, 64, respectively, which are attached, as by welding, to the lower edge regions of members 48, 50, respectively. Each plate is fashioned, as shown, to form a pair of side-by-side trapezoidal projections, such as projection 66 in plate 62 and confronting projection 68 in plate 64. The plate projections are tapered, moving radially outwardly away from a central region of the corresponding baffle window, to provide progressively less shielding between the target and the substrate, on moving radially outwardly toward opposite side regions of the substrate. The dimensions of each projection, indicated by the arrows f, g, and h are 2.5, 1.25, and 0.75 in., respectively, in the baffle under consideration.

Completing the description of baffle 42, the reduced-width left and right end portions of the baffle are covered at their lower edges by end plates 72, 74, respectively. The plates are attached to the adjoining lower edges of the baffle, as by welding. The plates are notched, as indicated, to a preferred depth of 0.25 in. in the instant embodiment. The central hole in each plate is used in fastening the baffle to the target. Baffle 42, including the four frame members, strips 56, 58 and 60, the two shield plates and end plates 72, 74, are preferably formed of sheet metal, such as stainless steel, with preferred thicknesses of between about 0.05 and 0.1 in.

Figure 5:
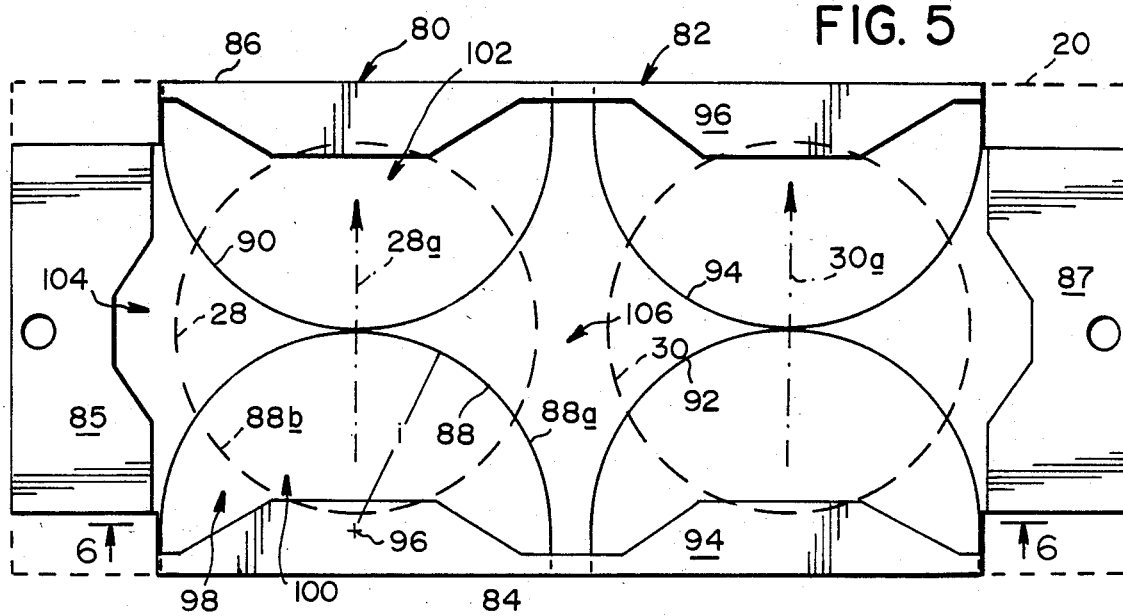
FIG. 5 is a plan view of a baffle constructed according to a second embodiment of the invention.
Figure 6:
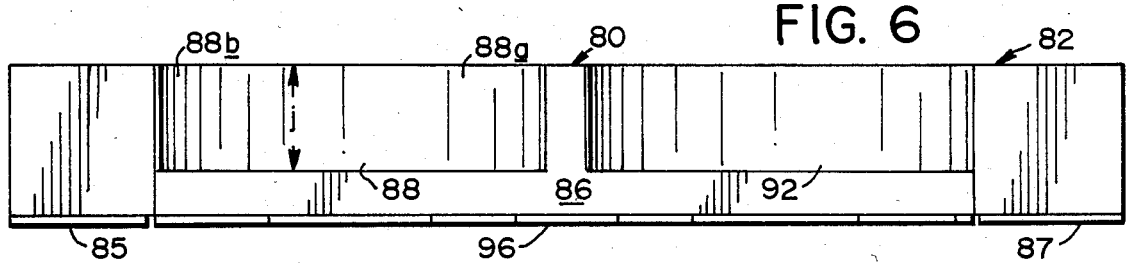
FIG. 6 is a sectional view taken generally along line 6—6 in FIG. 5.

FIGS. 5 and 6 illustrate, in plan and side-sectional views, respectively, a baffle 80 constructed according to a second embodiment of the invention. The baffle is intended to be used as one of two identical baffles in a sputtering station, such as that illustrated in FIGS. 1 and 2, also for use in achieving isotropic grain structure in a crystalline layer sputtered onto opposite sides of the substrate moving through the station. The baffle includes a frame 82 which is substantially identical to frame 46 in baffle 42. The frame's front and back frame members 84, 86, respectively, form front and back shields which act to limit deposition of sputtered target material to substrate regions directly underlying the target, as will be seen. The reduced-width end portions of the baffle are provided with end plates 85, 87, similar to plates 72, 74 in baffle 42, and are attached, as by welding, to associated lower edge portions of the frame.

The baffle contains four curved members 88, 90, 92, 94, disposed within the frame as shown in FIG. 5. Each member is attached, as by welding, to the associated inner face of the front or back frame member, and confronting curved members are attached to one another, also as by welding, at their point of connection midway between the front and back frame members. In a frame having the same dimensions of those of above-described frame 46, each of the curved members has a radius of curvature, indicated by arrow i in FIG. 5, of about 2.9 in. The center of the semi-circle formed by each member is indicated by a cross, such as the one at 96 in strip 88. The drawing also shows, in dashed lines, the outline of a pair of substrates 28, 30 which are centered directly below a target to which the baffle is attached, and in dash-dot lines at 28a and 30b, respectively, the center-line paths of travel of the two substrates through a sputtering station. As seen, each path of travel intersects the centers of the confronting curved members in the corresponding baffle region. As seen in FIG. 6, the upper edges of the looped members are flush with the upper edges of the frame, and extend a distance indicated by arrow j below the upper edges of the frame. The width j of the members is about 1.5 in. in a baffle whose frame width is about 2.2 in.

Each curved member, such as member 88, may be thought of as comprising a pair of quarter-circle baffle strips, such as strips 88a and 88b in strip 88. As can be appreciated with reference to FIG. 5, the two strips in each member 88, 92 are positioned symmetrically above opposite sides of a substrate, with such underlying a front portion of the target. The strips are adapted to produce substantially symmetrical sputtering from target side directions during early phases of layer deposition on each substrate, as will be described below.

The baffle further includes a pair of shield plates 94, 96 attached, as by welding, to the lower edges of the frame's front and back members, respectively. Each plate is fashioned, as shown, to form a pair of side-by-side trapezoidal projections having substantially the same dimensions as the above-described projections in baffle 42. As can be appreciated from FIG. 5, the exposed portion of each curved member—that is, the portion extending beyond the associated trapezoidal projection—defines a substantially semi-circular window, through which about half of a substrate can be viewed, when positioned in either the front or back region of the associated target. The semi-circular window formed by member 88 is indicated at 98 in FIG. 5. The baffle having the particular dimensions just described is adapted for use in sputtering onto a pair of substrates with diameters of about 5.25 in. or less. For substrates substantially larger than 5.25 in., target and baffle dimensions can be scaled up roughly proportionately, as with baffle 42.

Figure 7:
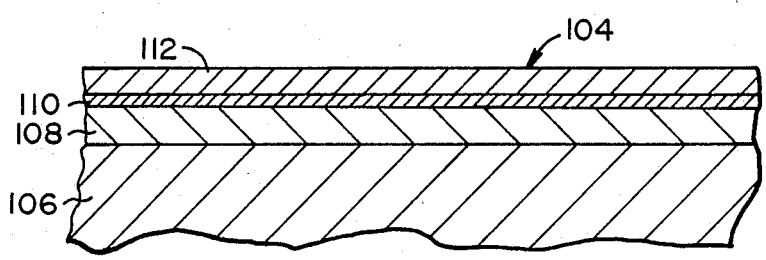
FIG. 7 is a sectional view of a surface portion of a magnetic recording medium formed in accordance with the invention.

The functioning of the above-described baffles in a sputtering system will now be described with reference to forming a magnetic recording medium according to the method of the invention. A fragmentary surface region of the medium, or disk 104, is shown sectionally in FIG. 7. The disk generally includes a substrate 106, and, forming successive thin-film layers over the substrate, a crystalline underlayer 108, a magnetic thin film 110, and a protective coating 112. It is understood that FIG. 7 illustrates only one of the two recording sides of disk 104, the "lower" magnetic recording surface having substantially the same construction as the upper recording surface. Although the sputtering steps will be described only with reference to events occurring on the upper substrate surface, it is recognized that substantially identical deposition events are occurring at the same time on the substrate's lower surface. In particular, the reference to a substrate as positioned "below" its target refers to the sputtering events occurring at the upper substrate surface, it being understood that the lower substrate surface is, at the same time, positioned above its target.

The disk is produced preferably in a sputtering system having four stations—an initial station at which substrate heating occurs, and three sputtering stations where the underlayer, magnetic thin film and outer coating are formed successively on the substrate. The substrate used in forming the disk is a conventional rigid aluminum alloy substrate of the type commonly in digital recording disks for read/write recording by a flying head which flies close to the recording surface. Rigid aluminum disks coated with a suitable surface alloy can be obtained from Poly Disk, Inc. (Los Angeles, CA) and Knudsen Systems, Inc. (Chino, CA).

The substrate, which is loaded in the system in a side-by-side arrangement on the two-substrate pallet, as described above, is moved initially into a heating station to heat the substrate to a desired surface temperature. Typically a heating source setting of 2.5 kw (on each side of the pallet) is employed. The heated substrate is then moved into a first sputtering station at which the crystalline underlayer is to be formed. The target in the sputtering station is equipped for sputtering a suitable pure metal or alloy, and preferably pure chromium, at a preferred target power of between about 0.8 and 4 kw. Each target in the first sputtering station is provided with a baffle constructed according to the present invention, such as above-described baffles 42 or 80. According to an important feature of the invention, the baffle functions in the sputtering station fist to insure that initial deposition of material onto the bare substrate occurs substantially under symmetrical sputtering conditions, to achieve initial isotropic crystal growth during the early phases of crystal growth of the underlayer. In subsequent phases of crystal growth, the baffle functions to limit front/back and side-directed deposition onto the substrate to angles which are substantially the same in magnitude as those seen by the substrate initially. That is, although increasingly asymmetrical deposition is allowed during the later phases of underlayer deposition, the baffle acts to block deposition at sputtering angles which are substantially lower than those initially seen by the substrate.

The operation of baffle 42 in achieving these two functions in the first sputtering station will now be described. Looking at FIGS. 2 and 3, it can be appreciated that as the substrate approaches the front of the sputtering station (from the right in FIG. 2) the front frame member, or shield 48 in the baffle, acts to limit deposition onto the substrate to substrate regions which directly underlie the target, i.e., low-angle deposition from the target onto approaching substrate regions outside of the target area is effectively shielded. This insures that the substrate does not see asymmetrical low-angle deposition in back-to-front directions, in the absence of direct overhead deposition. As the substrate first moves directly below the target region, asymmetrical front-to-back deposition is limited to angles which are no less than those allowed by the distance between the front and back of the baffle.

Also during the early phases of crystal growth on the substrate, central strap 58 acts to shield each substrate from material which would otherwise be sputtered at low angles from the opposite side of the target. On each side of the target, such as the left target side in FIG. 3, the central strip and the associated side strip, such as strip 56, are positioned symmetrically on the opposite sides of the center-line path of the substrate, which is moved below that side of the target. Each side strip, such as strip 56, functions to limit low-angle deposition from the associated reduced-width end region of the target such that side-directed sputtering onto the substrate is symmetrical and limited to angles which are no less than those allowed by the distance between the two strips. With reference to FIG. 1, the smallest side-directed angle allowed by the baffle is indicated by angle $\theta$, which is also roughly equal to the smallest angle allowed in front/back directions within the square window defined by the two strips and associated portions of the front and back shields. Also, as can be appreciated, the two strips allow unhindered deposition onto the substrate from the target region directly overlying the substrate, with such in the front deposition region. This latter feature serves to maximize the amount of material which can be sputtered onto the substrate under conditions of symmetrical deposition.

The initial layer formation events just described include formation of isolated crystal nuclei, growth of the isolated crystals, referred to as "island formation", and finally coalescence of the crystallites to form a continuous crystal layer. The thickness of the coalesced crystallite layer is typically about 200 Å and is formed, under usual sputtering conditions, in the first 10–25% of travel of the substrate through the sputtering station. This region, where the just-described early phases of crystal layer formation occur, is also referred to herein as the front deposition region.

Because of the degree of deposition angle symmetry and the need to limit low-angle deposition is greatest in the front deposition region, the baffle strips, and particularly the center baffle strip is preferably wide enough to block out substantially all deposition onto a substrate from the opposite side of the target. In a baffle having the dimensions mentioned above, strips 56, 58 and 60 are preferably about 1.5 in. wide.

Once the coalesced crystallite layer has formed on the substrate, continuing deposition may occur with less symmetrical sputtering without significantly disturbing the already-established crystal orientation directions formed in the front deposition region. In these later and final stages of deposition, which occur as the substrate passes through a back deposition region, the baffle acts principally to limit sputtering to angles which are substantially no less in magnitude than those seen by the substrate in the front sputtering region. In baffle 40, this function is accomplished by the back portions of strips 56, 58, which limit asymmetrical low-angle deposition from opposite sides of the target and back shield 50 which acts to prevent sputtering onto target regions which do not directly underlie the target as the substrate is being moved out of the target area.

The functioning of baffle 80 illustrates how a baffle with a quite different configuration functions in producing a substantially isotropic sputtered crystal layer, also according to the general principles of the invention. It is noted first that the early phases of layer formation—up to the coalesced crystallite stage—occur within each of the front curved members. As a substrate is moved into the sputtering station, front shield 84 in the baffle acts to limit deposition to substrate regions which directly underlie the target. At the same time, front/back deposition within each front curved member is limited to a relatively narrow range of angles allowed by the radius of the curved member. The two strips making up each curved member, such as strips 88A and 88B, in member 88, act to limit side-directed deposition to symmetrical angles which are somewhat larger than the smallest side-directed deposition angle allowed in baffle 42, and generally larger than this angle, due to the narrowing distance between the strips on moving rearward. As in 40, the two baffle strips which extend along the front deposition region allow substantially unhindered deposition of material onto the substrate from the target region directly overlying the substrate.

As the substrate moves from the semi-circular region defined by curved member 88, deposition angles are limited in a side-to-side direction, by curved member 90, whose two quarter-circle portions form rear extensions of baffle strips 88a, 88b in member 88. That is, members 88, 90 collectively form a pair of strips which extend in a generally front-to-back direction between the front and back shields in the baffle. Also limiting asymmetrical, low-angle deposition on the substrate is back shield 86, which acts to prevent sputtering onto target regions which do not directly underlie the back region of the target.

Summarizing the common elements of the baffles used in achieving an isotropic crystal structure in a sputtered layer, these include:

1. A front shield which acts to limit initial deposition onto a substrate substantially to substrate regions which directly underlie the target;

2. A pair of baffle strips disposed above opposite sides of a substrate, with such in a front deposition region of the target, to effect substantially unhindered side-to-side deposition of material onto the substrate in the front deposition region; and which extend between the two shields in a generally front-to-back direction.

It will be appreciated from FIGS. 1–3 and 5 that material deposition will be highest in the center region of each square window defined by the baffle. Therefore, as the substrate is moved through the sputtering station in a front-to-back direction, film thickness will be somewhat greater in a central front-to-back strip of each substrate, and gradually less on moving radially outwardly toward side regions of the substrate. This effect is compensated in the baffles by the trapezoidal projections, whose tapered construction acts to shield the substrate from central region deposition, preferentially, with progressively less shielding occurring on moving radially toward opposite sides of the substrate. In forming the magnetic recording medium of the invention, the underlayer is sputtered to a final thickness of between about 1000–4000 Å.

From the first sputtering station, at which an isotropic crystal underlayer is deposited, the substrate is moved into a second sputtering station at which magnetic thin film is formed. The second station is equipped for sputtering a suitable magnetic film alloy, and in one aspect of the present invention, an alloy containing about 70–88% cobalt, 10–28% nickel, and 2–10% chromium, and preferably of 74–78% cobalt, 15–25% nickel, and 5–10% chromium. The baffles used in the second sputtering station, such as baffles 42 or 80, function substantially as described above in achieving an isotropic grain structure in the magnetic-film layer sputtered onto the underlayers on each substrate.

The sputtering rate and substrate speed in the second sputtering station are adjusted to achieve a selected magnetic film thickness of about 300–1000 Å, and preferably between about 300–500 Å.

The remanence, coercivity, and loop-squareness ratio characteristics of a magnetic recording disk formed according to the above method were examined by conventional methods, as detailed in co-owned patent application for "Thin-Film Storage Disks Ser. No. 672,595 filed Nov. 15, 1984. The disk showed a magnetic remanence of at least $3 \times 10^{-3}$ EMU/cm$^2$, a coercivity of at least about 600 Orsteds, and a loop-squareness ratio of at least about 0.85. As described in the above-cited patent application, these advantageous characteristics are related particularly to the novel alloy composition forming the magnetic thin film, and to the formation of the magnetic thin film on a selected-thickness chromium underlayer.

Angular variations in peak-to-peak recording signal amplitude, which measure film thickness uniformity and the degree of crystal isotropy in the disk, were examined. The measurements were made using a Media Test Specialists certifier, operated in a conventional mode. The disk was rotated at 3600 rpm, and measurements were performed at an inner-track radius of 1.2 inches, and at an outer-track of 2.4 inches.

Figure 8A:
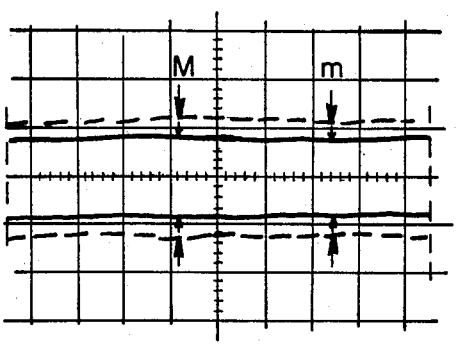
FIG. 8A shows variations in peak-to-peak recording signal amplitude, as a function of angular disk position, at inner diameter (solid lines) and outer diameter (dotted lines) recording tracks, in a magnetic recording medium constructed in accordance with the invention.

The inner-track peak-to-peak signal amplitude, recorded as a trace on an oscilloscope, is shown by the inner solid lines in FIG. 8A. The maximum peak-to-peak signal amplitude, measured at the position indicated at M in the figure, is about 10% higher than the minimum peak-to-peak amplitude arrow measured at position indicated at m. The outer envelope, shown in dashed lines in the figure, shows the peak-to-peak signal frequency measured over the disk at the outermost track. Again, there was only about a 10% difference between the maximum and minimum peak-to-peak amplitude measurements, as measured at the angular positions on the disk indicated by M and m.

Figure 8B:
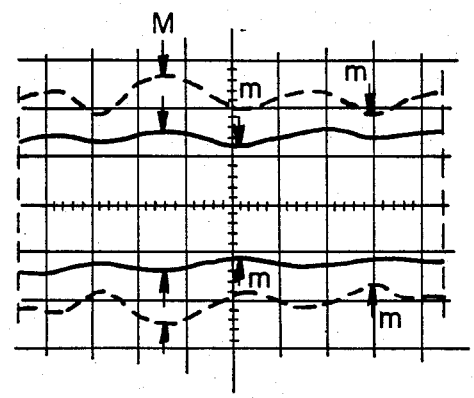
FIG. 8B is a view like FIG. 8A, showing variations in recording signal amplitude in a disk formed by conventional sputtering methods.

For comparative purposes, similar measurements on the angular variations of peak-to-peak signal amplitude were measured in a disk formed according to the general procedures described above, except where the underlayer and magnetic thin film were deposited under conventional sputtering-target baffle conditions, i.e., where the novel baffle of the invention was replaced by a conventional rectangular frame. The results of the measurements, which were performed substantially as described above, are shown in FIG. 8B. As in FIG. 8A, the envelopes of solid and dashed lines represent peak-to-peak signal amplitude variations over the surface of the disk measured at inner and outer track positions, respectively. The signal traces seen in FIG. 8B differ from those in FIG. 8A in two important respects. First, there is a substantial angular variation in peak-to-peak signal amplitude, particularly at the outer recording track. As measured at the positions indicated by arrows M and m, where maximum and minimum peak-to-peak signal levels were determined, the innermost track showed a variation of about 25%, and the outermost track showed a variation of about 40%. Secondly, the signal variation seen in the second disk, (formed under relatively anisotropic sputtering conditions) shows a periodic variation in signal amplitude, particularly at the outermost recording track. This periodic variation would be expected for a thin-film medium formed under sputtering conditions in which the symmetry of side-to-side deposition was substantially different than front-to-back deposition.

From the foregoing, it can be appreciated how various objects and features of the invention are met. The baffle of the invention functions in a sputtering system of the type described to produce substantially isotropic crystal-layer formation, without significantly reducing sputtering efficiency.

The baffle may include shield plates which act to reduce rates of deposition in central regions of the substrate, along the line of substrate travel, for use in achieving substantially uniform thickness in a sputtered thin-film layer.

The method of the invention allows for the production, in a high-throughput sputtering system, of magnetic recording disks having substantially uniform recording characteristics.

Finally, the recording magnetic disk of the invention has superior magnetic remanence, coercivity and loop squareness ratio characteristics related to the underlayer and magnetic thin-film compositions of the disk, and these characteristics, as reflected in peak-to-peak recording signal amplitude, are substantially uniform over the surface of the disk at both inner and outer recording tracks.

Although the invention has been described with reference to particular embodiments, it can be appreciated that various changes and modifications can be made without departing from the spirit of the invention. For example, a variety of baffle-strip configurations consistent with the described functioning of the baffle invention are contemplated, one being a baffle having the three strips as in baffle 42 and the front curved members as in baffle 80. Further, the baffle can be used in various types of sputtering systems to achieve substantially isotropic grain structure and uniform thickness in sputtered layers formed in optical media and in silicon wafer fabrication.

It is claimed:

1. In a sputtering apparatus having a target adapted to sputter a crystalline material on a substrate surface, to form a thin film thereon, and means for moving the substrate linearly, and without rotation, in a front-to-back direction below such target, successively through front and back deposition regions along a path which is offset from the front-to-back centerline of the target, a baffle for achieving a substantially isotropic grain structure in the sputtered crystalline material, comprising:

front and back shields positioned between the target and the moving means, for limiting deposition of sputtered material onto the substrate carried on the moving means, predominantly to substrate regions which directly underlie the target, and a pair of baffle strips (a) positioned above either side of the substrate, with such in the front deposition region, to effect substantially symmetrical, unhindered side-to-side sputtering of material onto the substrate in such front deposition region, and (b) extending between the two shields in a generally front-to-back direction.

2. The baffle of claim 1, wherein said baffle strips extend between said shields and define therewith a substantially square window through which the entire substrate can be viewed, when the substrate is moved to a position directly below the target.

3. The baffle of claim 2, wherein the substrate is adapted for movement through the deposition regions alongside a second substrate, below a rectangular sputtering target dimensioned to cover both substrates, during such movement, said pair of baffle strips includes a first strip extending along one side of the target and a second strip extending along such target front-to-back center line, and the baffle further includes a third baffle strip extending along the other side of the target and forming with said second strip a second pair of strips which define, along with said shields, a second substantially square window through which the entire second substrate can be viewed.

4. The baffle of claim 2, wherein the width of the second strip is dimensioned to eliminate substantially all deposition across such front-to-back target center line.

5. The baffle of claim 1, wherein said baffle strips define a substantially semi-circular window through which the front half of the substrate can be viewed, with the substrate moved about halfway into the area below the target.

6. The baffle of claim 5, wherein the baffle strips further define a substantially semi-circular window through which the back half of the sustrate can be viewed, with the substrate moved about halfway out of the area below the target.

7. The baffle of claim 1, for use in achieving such isotropic grain structure and substantially uniform layer thickness over the entire surface of a circular substrate, which further includes a projection which extends in a front/back direction and which has a tapered construction adapted to provide progressively less shielding between the target and substrate, on moving radially outwardly toward opposite side regions of the substrate.

* * * * *